United States Patent
Takayama et al.

(10) Patent No.: US 11,098,931 B2
(45) Date of Patent: Aug. 24, 2021

(54) PULSE TUBE REFRIGERATING MACHINE

(75) Inventors: Hirokazu Takayama, Tokyo (JP); Mingyao Xu, Tokorozawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 2411 days.

(21) Appl. No.: 12/153,849

(22) Filed: May 27, 2008

(65) Prior Publication Data

US 2008/0295524 A1    Dec. 4, 2008

(30) Foreign Application Priority Data

May 30, 2007 (JP) .............................. JP2007-143598

(51) Int. Cl.
*F25B 9/14* (2006.01)
*G01R 33/38* (2006.01)
*G01R 33/3815* (2006.01)

(52) U.S. Cl.
CPC .......... *F25B 9/145* (2013.01); *G01R 33/3804* (2013.01); *F25B 2309/1408* (2013.01); *F25B 2309/1418* (2013.01); *F25B 2309/14241* (2013.01); *F25B 2500/221* (2013.01); *G01R 33/3815* (2013.01)

(58) Field of Classification Search
CPC .............. F25B 9/145; F25B 2309/1408; F25B 2309/1418; F25B 2309/14241; F25B 2500/221; G01R 33/3804; G01R 33/3815
USPC ..... 62/6, 55.5; 60/520; 210/198.2, 199, 200, 210/201, 202; 285/373, 419, 411, 367, 285/137
See application file for complete search history.

(56) References Cited

U.S. PATENT DOCUMENTS

| | | | | |
|---|---|---|---|---|
| 2,665,928 A | * | 1/1954 | Omon et al. | 285/313 |
| 5,080,132 A | * | 1/1992 | Manz et al. | 137/614.04 |
| 5,181,383 A | * | 1/1993 | Goto et al. | 62/6 |
| 5,794,450 A | * | 8/1998 | Alexander | 62/6 |
| 6,094,921 A | * | 8/2000 | Zhu et al. | 62/6 |
| 6,378,312 B1 | * | 4/2002 | Wang | 62/6 |

(Continued)

FOREIGN PATENT DOCUMENTS

JP       09-170793 A    6/1997
JP       2001-272124    5/2001

(Continued)

*Primary Examiner* — Frantz F Jules
*Assistant Examiner* — Webeshet Mengesha
(74) *Attorney, Agent, or Firm* — Michael Best & Friedrich LLP

(57) ABSTRACT

A pulse tube refrigerating machine enables maintenance of an orifice while circulation of refrigerant gas within individual components is allowed, thus reducing the time required for maintenance. A compressor delivers a refrigerant gas having a high pressure and sucks the refrigerant gas having a low pressure. A cold head including a regenerator tube through which the refrigerant gas circulates and a pulse tube is connected to a housing. The flow of the refrigerant gas is controlled by one or more orifices, which are disposed outside the housing. The compressor, the housing, and the orifices are coupled via tubing. A coupling unit is disposed at both ends of at least one of the orifices. The coupling unit has a structure such that it can be split while the refrigerant gas is retained within the tubing. When the coupling unit is split, a detachable unit portion including the orifice is isolated.

17 Claims, 6 Drawing Sheets

(56) References Cited

U.S. PATENT DOCUMENTS

| | | | |
|---|---|---|---|
| 6,536,218 B1 * | 3/2003 | Steinmeyer | F25B 9/14 |
| | | | 310/52 |
| 2002/0066276 A1 * | 6/2002 | Kawano | F16K 11/074 |
| | | | 62/6 |
| 2005/0001194 A1 * | 1/2005 | Bachelder | 251/149.6 |
| 2006/0174635 A1 * | 8/2006 | Xu | F25B 9/145 |
| | | | 62/6 |

FOREIGN PATENT DOCUMENTS

| | | | | |
|---|---|---|---|---|
| JP | 2001272124 A | * | 10/2001 | F25B 9/00 |
| JP | 2003-194283 A | | 7/2003 | |
| JP | 2005024239 | * | 1/2005 | F25B 9/145 |
| JP | 3895516 B2 | | 12/2006 | |

\* cited by examiner

PULSE TUBE REFRIGERATING MACHINE

BACKGROUND OF THE INVENTION

1. Field of the Invention

The present invention relates to pulse tube refrigerating machines.

2. Description of the Related Art

Pulse tube refrigerating machines are used for cooling apparatuses that require a cryogenic environment, such as a superconducting magnet apparatus, a magnetic resonance imaging (MRI) diagnostic apparatus, or a liquefier.

In a pulse tube refrigerating machine, an operation in which a refrigerant gas (such as helium gas) that is a working fluid compressed by a gas compressor enters a regenerator tube and a pulse tube, and an operation in which the refrigerant gas is recovered by the gas compressor and caused to flow out of the pulse tube and the regenerator tube, are repeated, whereby coldness develops at a cold end of the regenerator tube and the pulse tube. By bringing the cold end into thermal contact with an object to be cooled, heat can be taken away from the object.

FIG. 1 shows a structure of a conventional double-inlet single-stage pulse tube refrigerating machine 1. The pulse tube refrigerating machine 1 includes a compressor 11, a valve unit 20, a housing 41, a flange 45, and a cold head 50. The cold head 50 includes a pulse tube 70 and a regenerator tube 60. Warm ends of the pulse tube 70 and the regenerator tube 60 are connected to a housing 41 via a flange 45.

The housing 41 is coupled with the valve unit 20 via tubing 21. The compressor 11 and the valve unit 20 are coupled with each other via tubes 12H and 12L.

The housing 41 may normally house a reservoir 30 and plural orifices 80 and 90 that are connected via the tubing 21. The compression and expansion steps of a refrigerant gas that circulates through the pulse tube 70 and the regenerator tube 60 are controlled using the orifices 80 and 90 such that a desired phase difference can be obtained. The reservoir 30 may be disposed outside the housing 41.

The aforementioned individual components of the pulse tube refrigerating machine may degrade over a long period of operation. For example, the sliding surfaces of valves in the valve unit 20 are worn by friction over long periods of use, resulting in the ease with which refrigerant gas leaks from the valve unit 20. Thus, maintenance is conventionally performed on the component parts of a pulse tube refrigerating machine at certain periods.

In a normal maintenance procedure, operation of the pulse tube refrigerating machine 1 is terminated, and the temperature of the cold head 50 is increased to room temperature. This is due to the fact that, because the components of the pulse tube refrigerating machine are integrally connected to each other using coupling tubes (such as the tubes 12H, 12L, and 21), a large amount of refrigerant gas that is contained within the components as a whole may be released to the atmosphere if one of the components is removed immediately after ceasing of operation of the pulse tube refrigerating machine 1. In particular, because a refrigerant gas such as helium tends to have increasingly greater specific gravity at lower temperatures, quite a large volume of refrigerant gas may be lost to the outside if maintenance work is initiated on a particular component in a relatively low-temperature condition. In order to minimize such a loss of refrigerant gas, typically the cold head 50 is brought back to room temperature prior to maintenance, so that as much refrigerant gas can be recovered as possible.

Thereafter, the component that is due for maintenance, which may be the valve unit 20, is removed from the pulse tube refrigerating machine for maintenance work. After the maintenance work is completed, the removed part (or a replacement part) is attached to its predetermined position, and then gas substitution of each component is performed to replace the air that has entered inside with refrigerant gas. The operation of the pulse tube refrigerating machine 1 is then resumed, and the cooling of the cold head 50 and an object to be cooled (not shown) is started again.

However, in this method, it takes a very long time before the pulse tube refrigerating machine can return to normal operation after maintenance is completed. Even after the temperature of the cold head 50 is raised to room temperature, leakage of a considerable amount of the refrigerant gas that remains inside the cold head 50 or tubing is unavoidable upon removal of a component for maintenance.

Furthermore, if the maintenance work extends over a long period, the temperature of the object that needs to be cooled may increase, resulting in a decrease in cooling efficiency. This is particularly problematic when it is necessary to keep cooling an object continuously at extremely low temperatures.

JP Patent No. 3895516 discloses that a valve unit alone is detached from a pulse tube refrigerating machine and sent for maintenance while a low-temperature refrigerant gas is retained by a pulse tube and a regenerator tube, using a self-sealing coupling disposed on each end of the valve unit.

Normally, however, the valve unit is not the only component of a pulse tube refrigerating machine of which maintenance is required. Other components, such as an orifice, are also subjected to maintenance periodically. In particular, the orifice has fine openings through which refrigerant gas passes. These openings may be easily clogged with abrasion powder that may enter from the valve unit, resulting in an unstable operation. Such clogging of the orifice also greatly affects a phase difference between pressure and velocity of refrigerant gas that circulates internally, thereby greatly influencing the cooling performance of the pulse tube refrigerating machine.

Thus, it is also necessary to perform periodical maintenance on orifices. Maintenance of such orifices is associated with the same problems as mentioned above in terms of the extended period between the increase in temperature of the pulse tube refrigerating machine and the resumption of operation, the loss of refrigerant gas, and the increase in temperature of the cooled object.

One way to deal with the above problems may be to apply the technology of the aforementioned JP Patent No. 3895516 to the orifices.

However, in many of conventional pulse tube refrigerating machines, orifices are installed within a housing, which is increasingly being required to be smaller in size and flat in structure due to the demand in the recent years for more compact pulse tube refrigerating machines. Thus, it is not desirable to put additional components inside the housing. It is therefore difficult in the case of an orifice to adopt a detachable structure such that the orifice alone can be detached from and then attached back to the pulse tube refrigerating machine while refrigerant gas is retained within its individual components, as opposed to the case of the valve unit, which is inherently disposed independently of the housing.

SUMMARY OF THE INVENTION

It is a general object of the present invention to provide a novel and useful apparatus in which the above problems are eliminated. A more specific object of the present invention is to provide a pulse tube refrigerating machine in which an orifice can be maintained while refrigerant gas is allowed to circulate through individual components of the pulse tube refrigerating machine, thereby reducing the time required for maintenance.

In one embodiment, a pulse tube refrigerating machine comprises a compressor configured to deliver a refrigerant gas having a high pressure and configured to suck the refrigerant gas having a low pressure; a housing to which a cold head is connected, the cold head including a regenerator tube through which the refrigerant gas passes and a pulse tube; and one or more orifices disposed outside the housing and configured to control the flow of the refrigerant gas. The compressor, the housing, and the one or more orifices are coupled via tubing. A coupling unit is disposed at each end of at least one of the one or more orifices. The coupling unit has a structure such that it can be split while the refrigerant gas is retained within the tubing. A detachable unit portion including the one or more orifices is isolated in the form of an individual unit upon separation of the coupling unit.

In a preferred embodiment, upon separation of the coupling unit, plural detachable unit portions each of which includes at least one orifice may be isolated.

In another preferred embodiment, the coupling unit may be disposed at each end of each of the orifices. Upon separation of the coupling unit, plural detachable unit portions each of which includes one orifice may be isolated.

In another preferred embodiment, upon separation of the coupling unit, one detachable unit portion that includes all of the one or more orifices may be isolated.

The pulse tube refrigerating machine may further include a valve unit connected between the regenerator tube and the compressor via tubing. Upon separation of the coupling unit, a detachable unit portion that includes at least one orifice and the valve unit may be isolated.

In a preferred embodiment, at least one of the coupling units may include a self-sealing coupling.

In accordance with an embodiment, a pulse tube refrigerating machine is provided in which an orifice can be removed for maintenance while a refrigerant gas is allowed to circulate within individual components, whereby the time required for maintenance can be reduced.

BRIEF DESCRIPTION OF THE DRAWINGS

These and other objects, features and advantages of the invention will be apparent to those skilled in the art from the following detailed description of the invention, when read in conjunction with the accompanying drawings, in which.

DETAILED DESCRIPTION OF THE PREFERRED EMBODIMENTS

Figure 1:
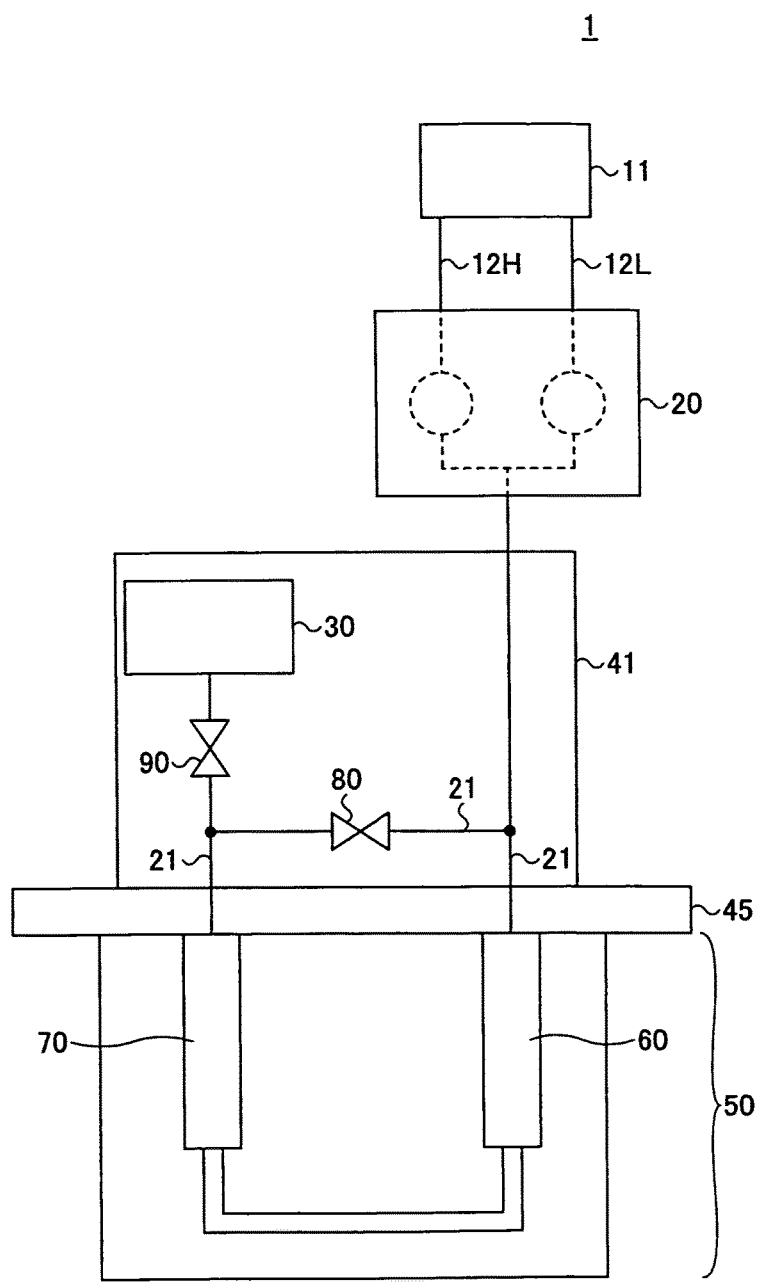
FIG. 1 shows a block diagram of a single-stage pulse tube refrigerating machine.

In the following, embodiments of the present invention are described with reference to the drawings, throughout which similar reference characters denote identical or corresponding features whenever appropriate.

Figure 2:
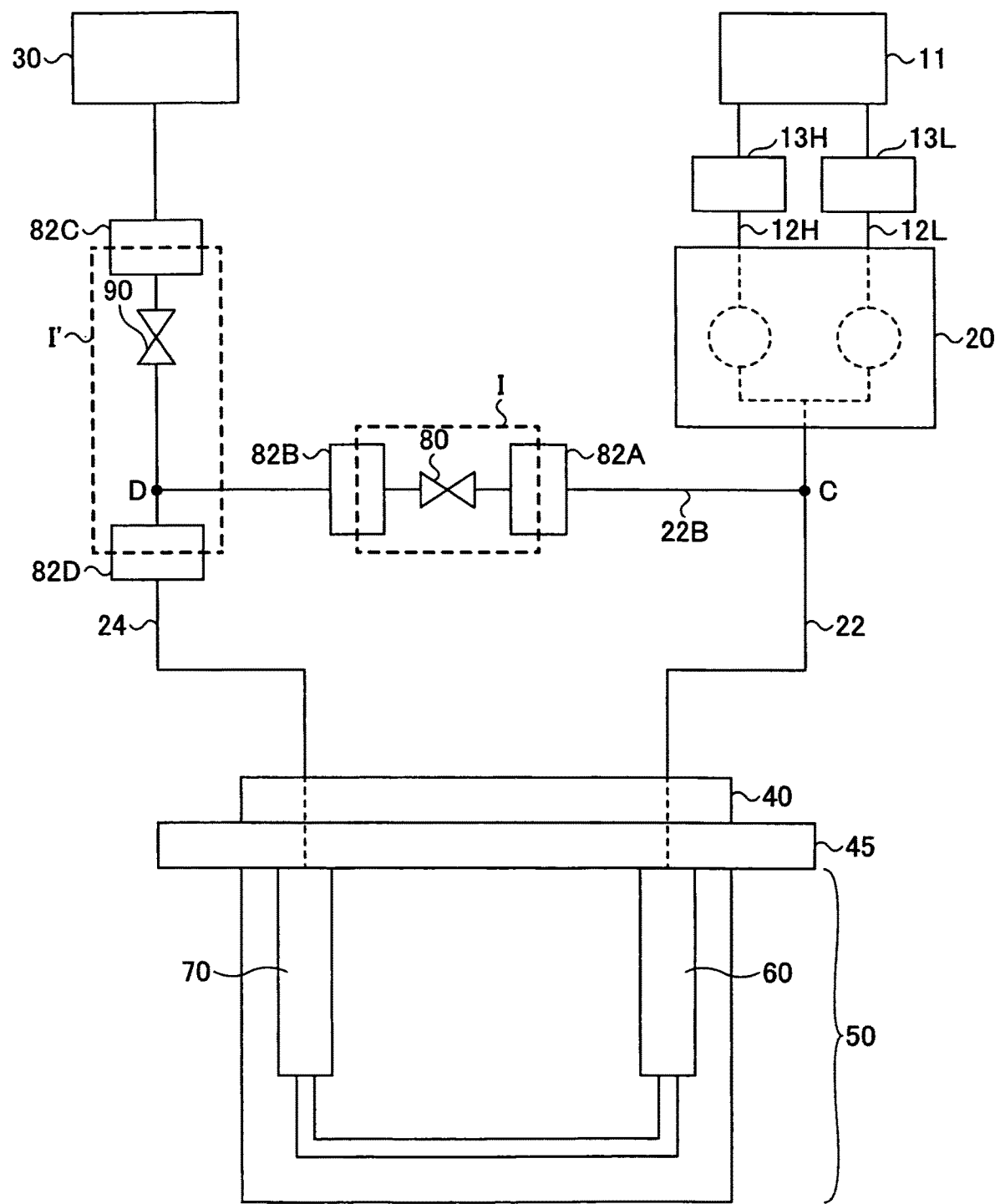
FIG. 2 shows a block diagram of a double-inlet single-stage pulse tube refrigerating machine according to an embodiment of the present invention.

FIG. 2 shows a block diagram of a pulse tube refrigerating machine 200 according to a first embodiment of the present invention. The pulse tube refrigerating machine 200 is of the so-called double-inlet and single-stage type.

As shown in FIG. 2, the single-stage pulse tube refrigerating machine 200 includes a gas compressor 11; a valve unit 20; a reservoir 30; a housing 40; a flange 45; and a cold head 50. The housing 40 is connected to the cold head 50 via the flange 45. The cold head 50 includes a regenerator tube 60 and a pulse tube 70, which are connected to each other at their cold ends (at the bottom of FIG. 2).

The gas compressor 11 and the valve unit 20 are connected to each other by a high-pressure side coupling tube 12H and a low-pressure side coupling tube 12L. Each of the high-pressure side coupling tube 12H and the low-pressure side coupling tube 12L is provided with refrigerant-gas-flow closing units (to be hereafter referred to as an "open/close unit") 13H and 13L.

The valve unit 20 is connected to the housing 40 via a first tube 22. The first tube 22 runs inside the housing 40 and is connected to the regenerator tube 60 in the cold head 50. The first tube 22 is connected to a branch tube 22B at a point C. The branch tube 22B is connected to a second tube 24 at a point D. The second tube 24 has one of its ends running inside the housing 40 and connecting to the pulse tube 70 of the cold head 50; the other end is connected to the reservoir 30.

Between points C and D of the branch tube 22B, a first orifice 80 is disposed. At both ends of the first orifice 80, first and second coupling units 82A and 82B are disposed (for convenience's sake, the coupling unit that is closer to point C is referred to as the first coupling unit 82A, and the coupling unit that is closer to point D is referred to as the second coupling unit 82B). Between point D of the second tubing 24 and the reservoir 30, a second orifice 90 is disposed. A third coupling unit 82C and a fourth coupling unit 82D are disposed between the second orifice 90 and the reservoir 30 and between point D of the second tubing 24 and the housing 40, respectively.

During the operation of the pulse tube refrigerating machine 200, a refrigerant gas compressed by the gas compressor 11 passes through the high-pressure side coupling tube 12H, the valve unit 20, the tube 22, the housing 40, and the flange 45, before it enters the regenerator tube 60. On the other hand, a low-pressure refrigerant gas is sucked by the gas compressor 11, passing through the tube 22 in the opposite direction via the low-pressure side coupling tube 12L. Thus, the open/close units 13H and 13L are open when the pulse tube refrigerating machine is operating.

It is noted herein that the orifices 80 and 90 of the pulse tube refrigerating machine 200 according to the present embodiment are disposed outside the housing 40, as opposed to the aforementioned structure shown in FIG. 1.

The first coupling unit 82A has a structure such that it can be split into two parts, with the flow of gas through the branch tube 22B at the first coupling unit 82A blocked.

Similarly, the second coupling unit 82B can be split into two parts with the flow of gas through the branch tube 22B at the second coupling unit 82B blocked. The third coupling unit 82C is splittable into two parts, with the flow of gas through the second tubing 24 at the third coupling unit 82C blocked. The fourth coupling unit 82D is also splittable into two parts, with the flow of gas through the second tubing 24 at the fourth coupling unit 82D blocked. When the thus separated two parts of each of the coupling units are joined back together, the refrigerant gas can pass through each complete coupling unit.

Thus, by splitting each of the first coupling unit 82A and the second coupling unit 82B, the orifice 80 can be isolated in the form of a unit portion I. Likewise, by splitting each of the third coupling unit 82C and the fourth coupling unit 82D, the orifice 90 can be isolated in the form of a unit portion I'. Conversely, by joining the separated two parts of each of the coupling units back together, the unit portions I and I' each having an orifice can be re-integrated with the pulse tube refrigerating machine 200.

The above is merely an exemplary structure of the first through the fourth coupling units 82A-82D. In another example, the coupling units may have a self-sealing coupling structure. This structure may involve a tube joint consisting of a male half and a female half, each fixed at the end of a tube. When the male and female halves are separated from each other, the ends of the tubes are closed by themselves. When the halves are joined, the tubes have fluid communication therethrough. When the first through the fourth coupling units 82A-82D have such a self-sealing coupling, the tip of each tube is automatically closed by releasing the coupling of the male half and the female half. By joining the two parts together, fluid communication is obtained again. Thus, by using the self-sealing coupling structure, two tubes can be joined and separated easily without allowing the refrigerant gas within them to leak outside.

Alternatively, each of the coupling units may consist of two valves and separable tubing members disposed between the valves. In this case, too, by releasing the coupling of the separable members after the two valves are closed, the coupling unit itself can be split while the refrigerant gas is retained within the tubes 22B, 22, and 24.

In the following, a description is given of an orifice maintenance work performed on the pulse tube refrigerating machine 200 according to the present embodiment as described above. The following description refers to a case where a self-sealing coupling structure is adopted in the coupling units 82A to 82D.

First, the operation of the pulse tube refrigerating machine 200 is stopped. Then the open/close units 13H and 13L are closed. The self-sealing coupling of each of the first and the second coupling units 82A and 82B is released. Similarly, the self-sealing coupling of each of the third and the fourth coupling units 82C and 82D is released. Thereby, the unit portions I and I' of the pulse tube refrigerating machine 200, which include the orifice 80 and the orifice 90, respectively, can be isolated as individual units. Because each of the coupling units consists of a self-sealing coupling, the refrigerant gas that exists within the components including the first and the second tubes 22 and 24 and the branch tube 22B can be prevented from being released to the atmosphere upon isolating the orifices (i.e., separating the portions including the orifices from the rest).

The thus isolated unit portions I and I' are detached, and then the orifices 80 and 90 are subjected to maintenance work.

After the maintenance work is complete, the orifices 80 and 90 are placed back at their predetermined positions, and then the male and female halves of each self-sealing coupling are re-coupled. Thus, the orifices 80 and 90 are put back as integral components of the pulse tube refrigerating machine 200. The coupling of the self-sealing couplings also reconstructs the passage for refrigerant gas.

Thereafter, the open/close units 13H and 13L are opened, and the compressor 11 is activated, whereby the operation of the pulse tube refrigerating machine is resumed.

Thus, in accordance with the present embodiment, the two orifice portions alone of the pulse tube refrigerating machine 200 can be detached as individual units, while the refrigerant gas is retained within the various components, such as the tubes 22, 24, and 22B and the cold head 50. This eliminates the need to bring the temperature of the cold head back to room temperature before maintenance in order to recover as much refrigerant gas as possible. Because the refrigerant gas is retained within the unit portions I and I' during maintenance, the operation to replace the gas within the unit portions I and I' with refrigerant gas after maintenance can be eliminated. As a result, the time required for maintenance work can be greatly reduced.

Because the orifice maintenance work is not by itself much time-consuming, there is only a little temperature increase in the cold head over the duration of maintenance work, i.e., from the ceasing of operation of the pulse tube refrigerating machine to the resumption of its normal operation. Thus, the temperature increase in the object to be cooled can also be minimized.

Because the individual components remain air-tight with respect to the atmosphere, the loss of refrigerant gas into the atmosphere can be minimized.

Furthermore, in accordance with the present embodiment, because the housing 40 does not contain the orifices 80 and 90 or the coupling members 82A to 82D, the structure of the housing 40 can be simplified. Accordingly, the housing 40 can be reduced in size and made more compact.

Figure 3:
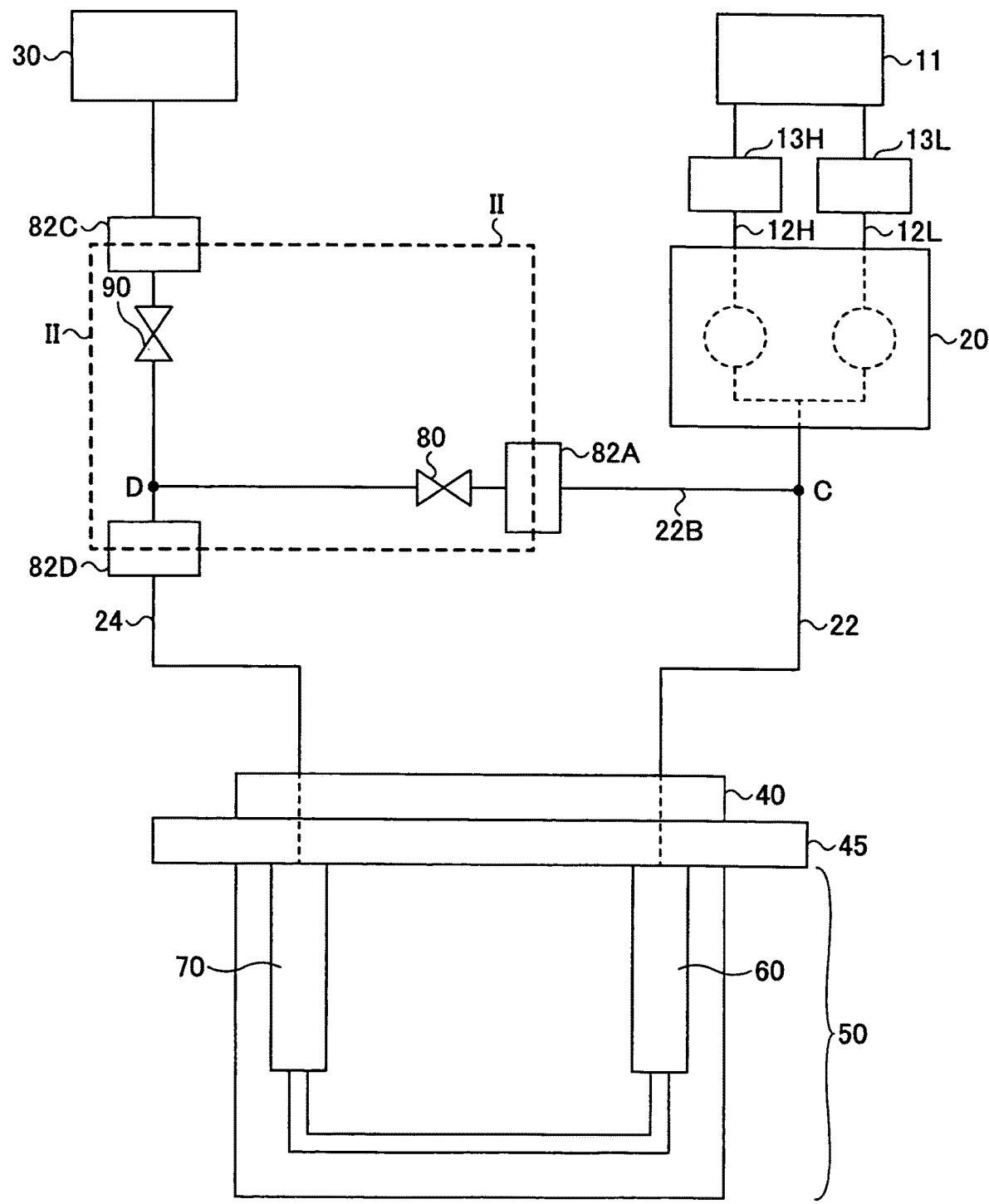
FIG. 3 shows a block diagram of a double-inlet single-stage pulse tube refrigerating machine according to another embodiment of the present invention.

FIG. 3 shows a block diagram of a pulse tube refrigerating machine 300 according to a second embodiment. The pulse tube refrigerating machine 300 is similar to the pulse tube refrigerating machine 200 shown in FIG. 2, with the exception that the second embodiment does not include the coupling unit 82B of the pulse tube refrigerating machine 200.

In the pulse tube refrigerating machine 300, a unit portion II that includes both orifices 80 and 90 can be isolated by releasing all of the couplings of the individual coupling units 82A, 82C, and 82D. Thus, the two orifices 80 and 90 can be detached in the form of a single integral portion for maintenance.

Figure 4:
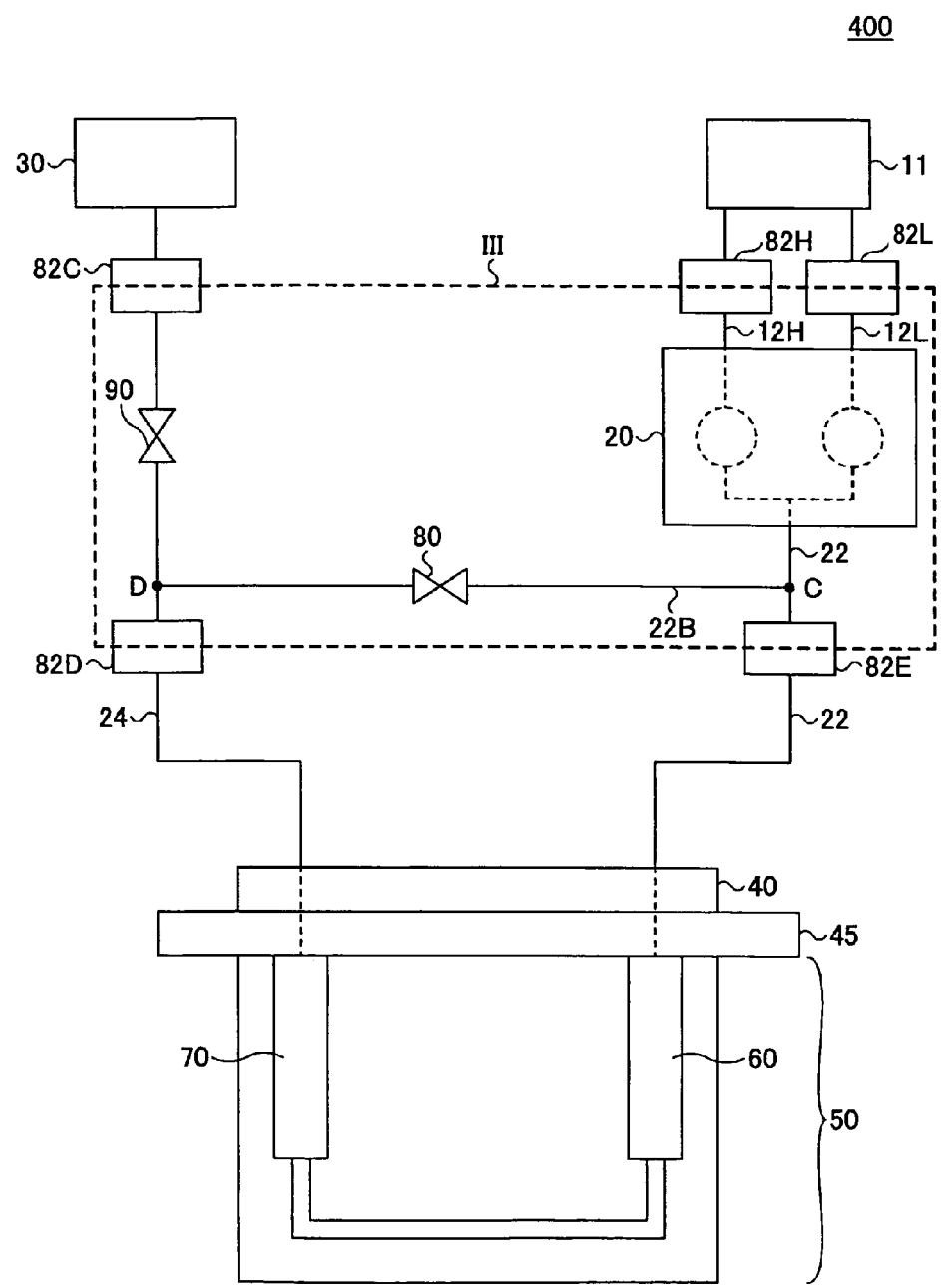
FIG. 4 shows a block diagram of a double-inlet single-stage pulse tube refrigerating machine according to yet another embodiment of the present invention.

FIG. 4 shows a pulse tube refrigerating machine 400 according to a third embodiment. The pulse tube refrigerating machine 400 is similar to the pulse tube refrigerating machine 300 shown in FIG. 3, with the exception that the coupling unit 82A of the pulse tube refrigerating machine 300 is replaced with a new coupling unit 82E disposed between point C of the first tube 22 and the housing 40. Further, in the present embodiment, the open/close units 13H and 13L of the pulse tube refrigerating machines 200 and 300 according to the foregoing embodiments, which are disposed between the compressor 11 and the valve unit 20, are replaced with coupling units 82H and 82L, which may consist of self-sealing couplings.

In the third embodiment, a unit III including the valve unit 20 in addition to the orifices 80 and 90 can be isolated by releasing all of the couplings of the coupling units 82C, 82D, 82E, 82H, and 82L. Thus, the two orifices 80 and 90 and the valve unit 20 can be detached in the form of an individual unit for maintenance.

It should be obvious to one skilled in the art that the above embodiments are merely exemplary. In another embodiment, another coupling unit may be disposed between the two orifices in the embodiment shown in FIG. 4. In this way, two unit portions, i.e., one unit portion that includes the orifice 90 and the other unit portion that includes the orifice 80 and the valve unit 20, can be formed. Thus, the number of unit portions, the number of orifices included in each unit portion, or the type of members included in each unit portion are not particularly limited as long as each unit portion includes at least one orifice and that such a unit portion is formed outside the housing.

While in the foregoing description various embodiments of the present invention have been described with reference to a double-inlet single-stage pulse tube refrigerating machine, it should be noted that various other embodiments are possible. In another embodiment, a double-inlet multiple-stage pulse tube refrigerating machine may be used. Further, the present invention may be embodied in connection with a single-stage or a multiple-stage refrigerating machine of an orifice type or a four-valve type.

Figure 5:
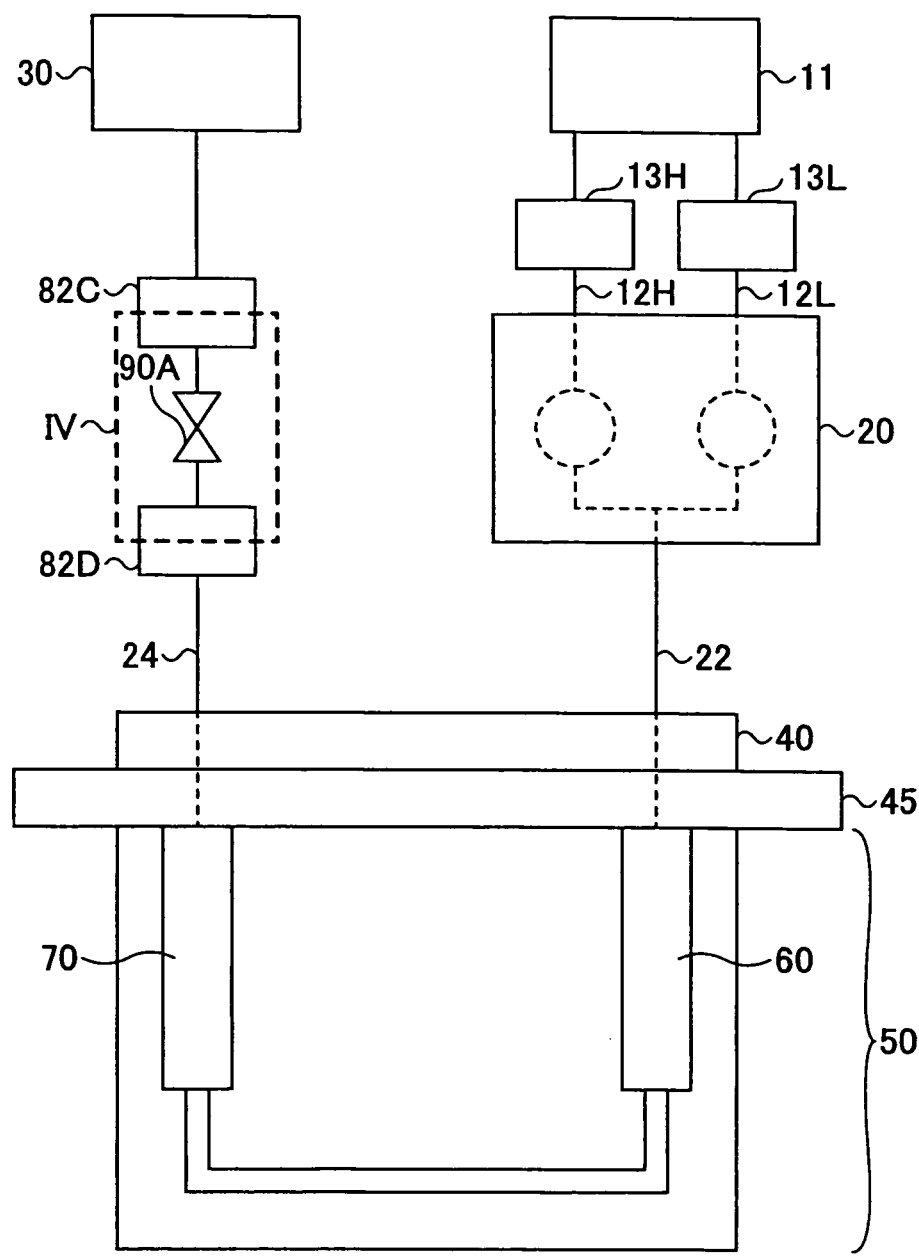
FIG. 5 shows a block diagram of an orifice pulse tube refrigerating machine according to another embodiment of the present invention.

FIG. 5 shows a block diagram of an orifice single-stage pulse tube refrigerating machine 500 according to an embodiment. In the orifice pulse tube refrigerating machine 500, as shown in FIG. 5, coupling units 82C and 82D are connected at both ends of an orifice 90A. By releasing these coupling units, a unit portion IV including the orifice 90A can be isolated.

Figure 6:
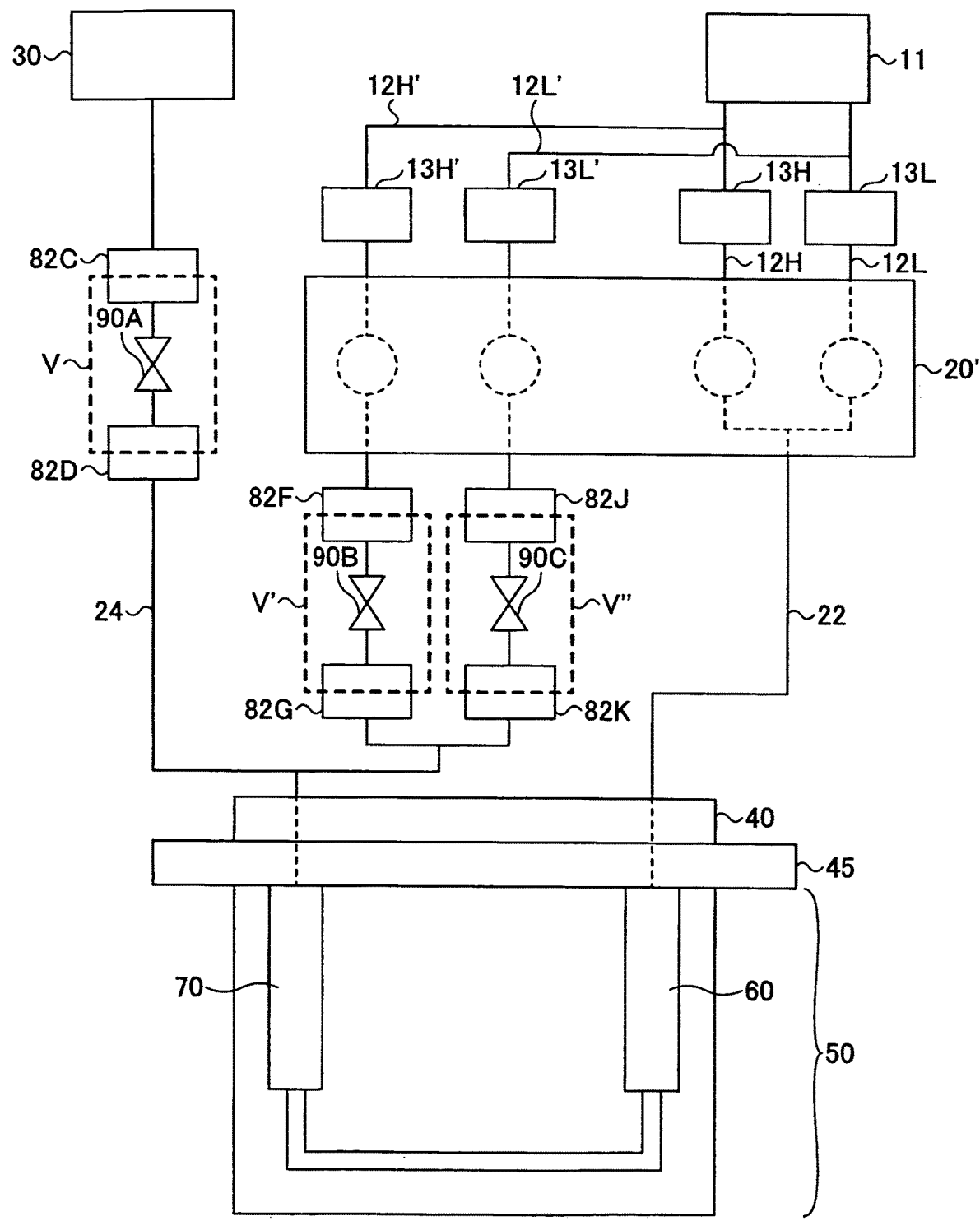
FIG. 6 shows a block diagram of a four-valve pulse tube refrigerating machine according to yet another embodiment of the present invention.

FIG. 6 shows a block diagram of a four-valve single-stage pulse tube refrigerating machine 600 according to another embodiment. In the four-valve pulse tube refrigerating machine 600, a valve unit 20' includes four valves, indicated by fine broken lines in FIG. 6. The valves are connected individually to a tube 12L provided with an open/close unit 13L, a tube 12H provided with an open/close unit 13H, a tube 12L' provided with an open/close unit 13L', and a tube 12H' provided with an open/close unit 13H'. The tubes 12H and 12L are joined within the valve unit 20' into a single tube 22, which then exits the valve unit 20' and is connected to a regenerator tube 60 via a housing 40 and a flange 45, as in the case of the refrigerating machine of the double-inlet type shown in FIG. 2. On the other hand, the tubes 12H' and 12L', after exiting the valve unit 20', are connected to one ends of orifices 90B and 90C, respectively. The other ends of the orifices 90B and 90C are connected to another tube 24 which is further connected to a reservoir 30. The tube 24 is provided with another orifice 90A. The tube 24 is connected to a pulse tube 70 via the housing 40 and the flange 45.

In the four-valve pulse tube refrigerating machine 600 according to the present embodiment, as shown in FIG. 6, coupling units 82C and 82D are connected at both ends of the orifice 90A. The coupling units 82F and 82G are connected at both ends of the orifice 90B. The coupling units 82J and 82K are connected at both ends of the orifice 90C. Thus, by releasing all of these coupling units, it becomes possible to individually isolate a unit portion V including the orifice 90A, a unit portion V' including the orifice 90B, and a unit portion V" including the orifice 90C.

The present invention may be applied to any refrigerating machine as long as it is a regenerative refrigerating machine equipped with an orifice. For example, the present invention may be applied to a Solvay refrigerating machine, which is a type of Gifford-McMahon (GM) refrigerating machine.

The present invention may be applied to regenerative refrigerating machines, such as a single-stage or multiple-stage pulse tube refrigerating machine, that are used in low-temperature systems, such as nuclear magnetic resonance diagnostic apparatuses, superconducting magnet apparatuses, and cryopumps.

The present application is based on the Japanese Priority Application No. 2007-143598 filed May 30, 2007, the entire contents of which are hereby incorporated by reference.

What is claimed is:

1. A pulse tube refrigerating machine comprising:
   a valve unit configured to receive a working fluid from an exhaust of a compressor and to output the working fluid to an intake of the compressor, a flow path of the working fluid from the valve unit to a cold head permits a flow of the working fluid between the cold head and the valve unit;
   a first coupling unit configured to sever the flow path of the working fluid from the valve unit to the cold head in a manner that permits a decoupling of the valve unit from the cold head, the decoupling of the valve unit from the cold head disconnects the cold head from the valve unit; and
   an orifice configured to control the flow of the working fluid between the cold head and the valve unit, the orifice is attached to the valve unit before the decoupling of the valve unit from the cold head in a manner that permits the orifice to remain attached to the valve unit after the decoupling of the valve unit from the cold head.

2. The pulse tube refrigerating machine according to claim 1, further comprising:
   a second coupling unit configured to sever a flow path of the working fluid from the cold head to the orifice in a manner that permits the decoupling of the orifice from the cold head, the flow path of the working fluid from the cold head to the orifice permits a flow of the working fluid between the cold head and the orifice.

3. The pulse tube refrigerating machine according to claim 2, wherein the first coupling unit is configured to permit a coupling of the cold head with the valve unit by connecting the valve unit to the cold head, the second coupling unit is configured to permit a coupling of the cold head with the orifice by connecting the orifice to the cold head.

4. The pulse tube refrigerating machine according to claim 2, wherein at least one of the first and the second coupling units is a self-sealing coupling unit.

5. The pulse tube refrigerating machine according to claim 2, wherein the first and second coupling units are configured to automatically close the flow path of the working fluid from the cold head to the valve unit and the orifice respectively after the decoupling of the valve unit from the cold head.

6. The pulse tube refrigerating machine according to claim 2, further comprising:
   a third coupling unit configured to permit a decoupling of the valve unit from the compressor in a manner that disconnects the compressor from the valve unit.

7. The pulse tube refrigerating machine according to claim 6, wherein the third coupling unit is configured to permit a coupling of the compressor with the valve unit by connecting the valve unit to the compressor.

8. The pulse tube refrigerating machine according to claim 6, wherein the third coupling unit is a self-sealing coupling unit.

9. The pulse tube refrigerating machine according to claim 6, wherein the third coupling unit is configured to automatically close a flow path of the working fluid from the valve unit to the compressor after the decoupling of the valve unit from the compressor.

10. The pulse tube refrigerating machine according to claim 9, wherein the flow path of the working fluid from the valve unit to the compressor permits a flow of the working fluid between the valve unit and either the exhaust of the compressor or the intake of the compressor.

11. The pulse tube refrigerating machine according to claim 1, further comprising:
a tube configured to provide the flow path of the working fluid from the valve unit to the cold head.

12. The pulse tube refrigerating machine according to claim 11, wherein a first segment of the tube couples the valve unit to the first coupling unit, the working fluid remains in the tube after the decoupling of the valve unit from the cold head.

13. The pulse tube refrigerating machine according to claim 12, wherein a second segment of the tube couples the first coupling unit to the cold head, the decoupling of the valve unit from the cold head separates the first segment of the tube from the second segment of the tube.

14. The pulse tube refrigerating machine according to claim 13, wherein the cold head includes a regenerator tube, the second segment of the tube couples the first coupling unit to the regenerator tube.

15. The pulse tube refrigerating machine according to claim 14, wherein the cold head includes a pulse tube, tubing connects the pulse tube to the regenerator tube.

16. The pulse tube refrigerating machine according to claim 1, wherein the compressor is configured to compress the working fluid so that the pressure the working fluid at the exhaust of the compressor is higher than the pressure the working fluid at the intake of the compressor.

17. The pulse tube refrigerating machine according to claim 1, wherein the working fluid is a refrigerant gas.

* * * * *